(12) United States Patent
Werner et al.

(10) Patent No.: US 8,030,209 B2
(45) Date of Patent: Oct. 4, 2011

(54) ENHANCING STRUCTURAL INTEGRITY OF LOW-K DIELECTRICS IN METALLIZATION SYSTEMS OF SEMICONDUCTOR DEVICES BY USING A CRACK SUPPRESSING MATERIAL LAYER

(75) Inventors: Thomas Werner, Moritzburg (DE); Kai Frohberg, Niederau (DE); Frank Feustel, Dresden (DE)

(73) Assignee: GLOBALFOUNDDRIES Inc., Grand Cayman (KY)

( * ) Notice: Subject to any disclaimer, the term of this patent is extended or adjusted under 35 U.S.C. 154(b) by 56 days.

(21) Appl. No.: 12/507,299

(22) Filed: Jul. 22, 2009

(65) Prior Publication Data
US 2010/0055903 A1    Mar. 4, 2010

(30) Foreign Application Priority Data
Aug. 29, 2008    (DE) .......................... 10 2008 045 035

(51) Int. Cl.
*H01L 21/302* (2006.01)
*H01L 21/461* (2006.01)
(52) U.S. Cl. ..... 438/645; 216/88; 216/89; 257/E21.304; 257/E21.583; 438/701
(58) Field of Classification Search ............... 438/645, 438/701; 257/E21.243, E21.249, E21.25, 257/E21.304, E21.49, E21.583, E21.483; 216/100, 88, 89
See application file for complete search history.

(56) References Cited

U.S. PATENT DOCUMENTS

| | | | |
|---|---|---|---|
| 6,475,925 B1 * | 11/2002 | Braeckelmann et al. ...... | 438/763 |
| 6,653,224 B1 * | 11/2003 | Gotkis et al. .................. | 438/627 |
| 7,009,280 B2 * | 3/2006 | Angyal et al. ................ | 257/642 |
| 2003/0047710 A1 * | 3/2003 | Babu et al. .................... | 252/79.1 |
| 2003/0109128 A1 * | 6/2003 | Koganei ........................ | 438/622 |
| 2003/0200702 A1 * | 10/2003 | Lee et al. ........................ | 51/298 |
| 2004/0018750 A1 * | 1/2004 | Sophie et al. ................. | 438/792 |
| 2004/0121704 A1 * | 6/2004 | Sakurai et al. .................... | 451/5 |
| 2004/0214446 A1 * | 10/2004 | Kim et al. ..................... | 438/706 |
| 2004/0241946 A1 * | 12/2004 | Kim et al. ..................... | 438/279 |
| 2005/0009320 A1 * | 1/2005 | Goundar ....................... | 438/624 |
| 2005/0212137 A1 * | 9/2005 | Yamamoto et al. ........... | 257/758 |
| 2005/0227476 A1 * | 10/2005 | Inoue ............................ | 438/618 |
| 2007/0252278 A1 * | 11/2007 | Li et al. ......................... | 257/751 |
| 2008/0057720 A1 * | 3/2008 | Frohberg et al. .............. | 438/699 |
| 2008/0286918 A1 * | 11/2008 | Shaviv .......................... | 438/211 |
| 2009/0045164 A1 * | 2/2009 | Farkas et al. .................... | 216/38 |

FOREIGN PATENT DOCUMENTS

DE    102004042168 A1 *    3/2006

OTHER PUBLICATIONS

Translation of Official Communication from German Patent Office for German Patent Application No. 10 2008 045 035.9 dated May 20, 2009.*

* cited by examiner

*Primary Examiner* — Caridad Everhart
(74) *Attorney, Agent, or Firm* — Williams, Morgan & Amerson, P.C.

(57) ABSTRACT

During the formation of metallization layers of sophisticated semiconductor devices, the damaging of sensitive dielectric materials, such as ULK materials, may be significantly reduced during a CMP process by applying a compressive stress level. This may be accomplished, in some illustrative embodiments, by forming a compressively stressed cap layer on the ULK material, thereby suppressing the propagation of micro cracks into the ULK material.

24 Claims, 7 Drawing Sheets

ENHANCING STRUCTURAL INTEGRITY OF LOW-K DIELECTRICS IN METALLIZATION SYSTEMS OF SEMICONDUCTOR DEVICES BY USING A CRACK SUPPRESSING MATERIAL LAYER

BACKGROUND OF THE INVENTION

1. Field of the Invention

The present disclosure generally relates to the field of fabricating semiconductor devices, and, more particularly, to metallization systems including low-k dielectric materials.

2. Description of the Related Art

Today's global market forces manufacturers of mass products to offer high quality products at a low price. It is thus important to improve yield and process efficiency to minimize production costs. This holds especially true in the field of semiconductor fabrication, since, here, it is essential to combine cutting-edge technology with volume production techniques. One important aspect in realizing the above strategy is seen in continuously improving device quality with respect to performance and reliability, while also enhancing the diversity of functions of semiconductor devices. These advances are typically associated with a reduction of the dimensions of the individual circuit elements, such as transistors and the like. Due to the continuous shrinkage of critical feature sizes, at least in some stages of the overall manufacturing process, frequently, new materials may have to be introduced to adapt device characteristics to the reduced feature sizes. One prominent example in this respect is the fabrication of sophisticated metallization systems of semiconductor devices in which advanced metal materials, such as copper, copper alloys and the like, are used in combination with low-k dielectric materials, which are to be understood as dielectric materials having a dielectric constant of approximately 3.0 and significantly less, in which case these materials may also be referred to as ultra low-k dielectrics (ULK). By using highly conductive metals, such as copper, the reduced cross-sectional area of metal lines and vias may at least be partially compensated for by the increased conductivity of copper compared to, for instance, aluminum, which has been the metal of choice over the last decades, even for sophisticated integrated devices.

On the other hand, the introduction of copper into semiconductor manufacturing strategies may be associated with a plurality of problems, such as sensitivity of exposed copper surfaces with respect to reactive components, such as oxygen, fluorine and the like, the increased diffusion activity of copper in a plurality of materials typically used in semi-conductor devices, such as silicon, silicon dioxide, a plurality of low-k dielectric materials and the like, copper's characteristic of generating substantially no volatile byproducts on the basis of typically used plasma enhanced etch processes, and the like. For these reasons, sophisticated inlaid or damascene process techniques have been developed in which typically the dielectric material may have to be patterned first in order to create trenches and via openings, which may then be coated by an appropriate barrier material, followed by the deposition of the copper material. Consequently, a plurality of highly complex processes, such as the deposition of sophisticated material stacks for forming the interlayer dielectric material including low-k dielectrics, patterning the dielectric material, providing appropriate barrier and seed materials, filling in the copper material, removing any excess material and the like, may be required for forming sophisticated metallization systems, wherein the mutual interactions of these processes may be difficult to assess, in particular, as material compositions and process strategies may frequently change in view of further enhancing overall performance of the semiconductor devices.

For example, the continuous shrinkage of the critical dimensions may also require reduced dimensions of metal lines and vias formed in the metallization system of sophisticated semiconductor devices which may lead to closely spaced metal lines, which in turn may result in increased RC (resistive capacitive) time constants. These parasitic RC time constants may result in significant signal propagation delay, thereby limiting overall performance of the semiconductor device, although highly scaled transistor elements may be used in the device level. For this reason, the parasitic RC time constants may be reduced by using highly conductive metals, such as copper, in combination with dielectric materials of very reduced permittivity, also referred to as ULK materials, as previously discussed. On the other hand, these materials may exhibit significant reduced mechanical and chemical stability, for instance when exposed to the various reactive etch atmospheres and mechanical stress, for instance during etch processes, resist removal, the removal of excess metal by chemical mechanical polishing (CMP) and the like.

For example, the reduced mechanical stability of the low-k dielectric material, in particular when ULK materials are considered, may result in increased damage during the CMP process, which may typically require the provision of an additional cap layer, which may be removed during the chemical mechanical polishing process. However, in sophisticated applications, a high degree of damaging may still be observed, as will be described in more detail with reference to FIGS. 1a-1c.

FIG. 1a schematically illustrates a cross-sectional view of a semiconductor device 100 at a manufacturing stage in which a metallization system is to be formed on the basis of sensitive dielectric materials in combination with highly conductive metals. As illustrated, the semiconductor device 100 comprises a substrate 101 above which may be formed a plurality of device levels, i.e., various levels in which circuit elements and other device features may be formed. For example, the substrate 101 may have incorporated therein an appropriate semiconductor layer in and above which circuit elements, such as transistors and the like, may be formed in accordance with design rules of the device 100. For instance, in complex semiconductor devices formed on the basis of CMOS technology, transistors having a gate length of 50 nm and less may be provided in the device level. Furthermore, any appropriate contact structure connecting to the circuit elements may be provided so as to act as an interface between the circuit elements and a metallization system 120 of the semiconductor device 100. For convenience, any such contact structures are not shown in FIG. 1a. The metallization system 120 may comprise a plurality of metallization layers 110 and 130, wherein the number of metallization layers in the system 120 may depend on the overall complexity of the semiconductor device 100. For example, the metallization layer 110 comprises an appropriate dielectric material 111, such as a low-k dielectric material, whose dielectric constant may be 3.0 or significantly less, such as 2.0, when ULK materials are considered. It should be appreciated that the dielectric material 111 may comprise different material compositions, depending on the overall device requirements. Furthermore, one or more metal lines 112 may be formed in the dielectric material 111 and may represent respective metal lines or any other metal regions as required according to the overall circuit layout of the device 100. The metal line 112 may comprise a conductive barrier material 112A, which may act as an interface between a highly conductive metal 112B, such as copper, copper alloy and the like, and the dielectric material 111.

Hence, the conductive barrier material 112A may suppress any diffusion of reactive components, such as oxygen, fluorine and the like, to the copper-based metal 112B in order to suppress any unwanted chemical reaction, while on the other hand out-diffusion of copper atoms into the surrounding dielectric material 111 may also be suppressed by the barrier material 112A. For example, tantalum nitride, tantalum and the like are well-established barrier materials used in view of maintaining a desired chemical and mechanical integrity of the metal 112B. Moreover, an etch stop layer 113 may be formed on the dielectric material 111 and on the metal line 112, wherein the etch stop layer 113 may, in some approaches, also act as a cap material for confining the metal 112B.

Similarly, the metallization layer 130 may comprise a low-k dielectric material 131, such as a ULK material, when the metallization layer 130 may represent a critical metallization level with respect to parasitic RC time constants. That is, in complex metallization systems, such as the system 120, at least some metallization levels may require a reduced parasitic capacitance between neighboring metal lines, thereby demanding a very low dielectric constant of the dielectric material 131. On the other hand, the reduction of the dielectric constant is typically associated with a reduced density and thus mechanical stability of the dielectric material 131, which may affect the further processing of the device 100. For example, exposure to reactive atmospheres during process steps, such as etching, resist stripping and the like, may cause the creation of a damaged surface area which may result in reliability concerns and non-uniformities during the further processing. Furthermore, the reduced mechanical stability may also lead to increased yield loss during planarization processes, such as CMP, which is conventionally addressed by providing an additional dielectric cap layer 135 which is comprised of a dielectric material of increased stability, such as silicon dioxide and the like, thereby reducing degradation of severe defects during the CMP process to be applied in a later manufacturing stage. Moreover, in the manufacturing stage shown, the metallization layer 130 may further comprise an interconnect structure 132 including a metal line 132L and a via 132V that connects to the metal line 112 of the metallization layer 110. The interconnect structure 132 may also comprise a barrier layer 132A which may have a similar composition to the barrier layer 112A. In the manufacturing stage shown, the interconnect structure 132 may be filled with a conductive metal, such as copper, which may be provided in an amount so as to reliably fill the metal line 132L. Hence, a certain amount of excess material may have to be provided, which may be removed by a CMP process.

The semiconductor device 100 as shown in FIG. 1a may be formed on the basis of well-established process techniques including the formation of any circuit elements, such as transistors and the like, in and above the substrate 101. Thereafter, an appropriate contact structure may be formed using well-established techniques and thereafter the metallization layer 110 may be formed by depositing the dielectric material 111 and patterning the same using well-established lithography and etch techniques. Next, the barrier layer 112A may be formed, followed by the electrochemical deposition of the copper material, an excess material of which may be removed by CMP. It should be appreciated that a corresponding cap material may also be used for forming the metallization layer 110 when the dielectric material 111 may suffer from a reduced mechanical stability. In this case, similar techniques may be used as will be described when referring to the metallization layer 130. Thus, after planarizing the surface topography, the etch stop layer 113 may be formed, for instance comprised of silicon carbide, nitrogen-containing silicon carbide and the like, followed by the deposition of the dielectric material 131 which may include, at least partially, a highly sensitive portion having a reduced dielectric constant. Next, the cap layer 135 may be formed, for instance in the form of silicon dioxide and the like, using well-established thermally activated chemical vapor deposition (CVD), plasma assisted CVD and the like. Next, an appropriate patterning regime may be used, such as a dual damascene or dual inlaid technique, in which a via opening and a trench opening may be formed in the dielectric material 131 and the cap layer 135 followed by the deposition of the barrier material 132A and the filling in of the copper material. Next, a CMP process 102 may be performed to remove excess material of the copper and the barrier layer 132A. During a CMP process, typically, an appropriate slurry material may be applied to the surface to be polished, which is selected such that a desired chemical reaction may be induced. At the same time, a physical polishing component may be created by relatively moving the surface to be polished with respect to a polishing pad, thereby obtaining a total removal rate that is determined by the characteristics of the slurry material and the parameters of the polishing process, such as down force, speed of the relative motion and the like. Due to the physical component, therefore, certain mechanical stress is exerted to the surface to be polished and thus to the dielectric material 131, wherein the cap layer 135 is provided to provide enhanced mechanical strength.

FIG. 1b schematically illustrates the semiconductor device 100 in a further advanced phase of the CMP process 102. As illustrated, during the removal of the excess copper material and also during the polishing of the cap layer 135, the mechanical stress of the polishing process 102 may result in the creation of micro cracks 135C, which may form in the surface that is in immediate contact with the polishing pad of the corresponding CMP tool. The size and the number of micro cracks 135C may significantly depend on process parameters, such as down force and relative speed, and may therefore require a corresponding adaptation of these CMP parameters, thereby resulting in an overall reduced removal rate. On the other hand, with respect to overall process throughput, a minimum removal rate may be required, thereby also producing a certain degree of defects in the form of the micro cracks 135C. It has been recognized, however, that, due to the provision of the cap layer 135, the micro cracks 135C may frequently be increased during the polishing process 102, thereby deepening the cracks 135C, which may thus extend into the dielectric material 131 (see FIG. 1c) and which may result in reduced reliability during the further processing after the removal of the cap layer 135. For instance, the micro cracks 135C may further propagate into the dielectric material 131 during further manufacturing processes, such as the formation of further metallization layers, which may finally result in an overall reduced mechanical stability, which in turn may result in significant yield losses in a very advanced manufacturing stage due to delamination of metallization layers and the like, or which may result in reduced reliability of the metallization system during operation of the device 100.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to techniques for forming metallization layers including sensitive dielectric materials, such as ULK materials, wherein the mechanical integrity of the sensitive dielectric material may be enhanced, for instance during CMP processes, by applying a compressive stress, at least during the CMP process, when excess material is to be removed from above the sensitive dielectric material. The application of a compressive stress may efficiently reduce the propagation of micro cracks, which may be caused by the planarization process, thereby reducing the probability of creating defects in the sensitive dielectric material. In some illustrative aspects disclosed herein, the compressive stress may be applied by forming a compressive cap layer on or above the sensitive dielectric material so that micro cracks, created in the cap layer during a planarization process, may encounter a compressive force which may thus reduce the probability of a further propagation of the cracks into the sensitive dielectric material.

One illustrative method disclosed herein comprises forming a compressive cap layer on a low-k dielectric material of a metallization layer of a semiconductor device. The method further comprises forming an opening in the cap layer and the low-k dielectric material. Furthermore, a metal is filled into the opening and at least a portion of the compressive cap layer and excess material of the metal is removed by performing a planarization process.

A further illustrative method disclosed herein comprises providing a substrate having formed thereabove a metallization layer for a semiconductor device, wherein the metallization layer comprises a low-k dielectric material. The method additionally comprises inducing a compressive stress in the low-k dielectric material and removing excess material from above the low-k dielectric material by performing a planarization process while maintaining the compressive stress.

A still further illustrative method disclosed herein relates to forming a metallization layer of a semiconductor device. The method comprises forming an opening in a low-k dielectric material formed above a substrate and filling in a metal-containing material in the opening. The method additionally comprises applying compressive stress to the low-k dielectric material and removing excess material of the metal-containing material by performing a chemical mechanical polishing process while maintaining at least a portion of the compressive stress.

BRIEF DESCRIPTION OF THE DRAWINGS

The disclosure may be understood by reference to the following description taken in conjunction with the accompanying drawings, in which like reference numerals identify like elements, and in which.

Figure 1A:
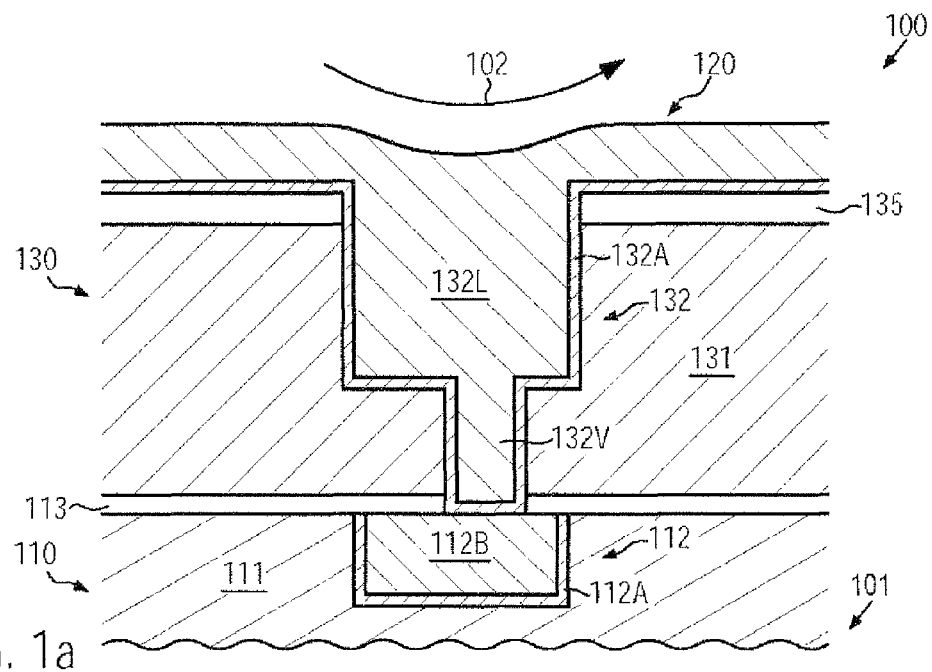
FIGS. 1a-1c schematically illustrate cross-sectional views of a semiconductor device during various manufacturing stages in forming a metallization layer including a ULK dielectric material, according to conventional strategies.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure relates to techniques for enhancing mechanical integrity of sensitive dielectric materials during the formation of metallization layers by applying compressive stress at least during the planarization process for removing excess metal and planarizing the overall surface topography in complex metallization systems. According to some illustrative embodiments, the compressive stress may be applied by providing a dielectric cap layer on or above a sensitive dielectric material, such as a ULK material, i.e., a dielectric material having a dielectric constant of approximately 2.7 or lower, wherein the compressively stressed cap layer may reduce the probability of creating micro cracks, which may extend into the sensitive dielectric material. Thus, contrary to conventional approaches in which frequently a cap layer material of tensile stress may be used, which may even contribute to an increased probability of transferring micro cracks from the cap material into the dielectric material, the compressive forces within the cap material may result in a corresponding "counter force" with respect to any mechanical stress induced during the polishing process. Furthermore, the compressive stress of the cap layer may also be transferred into the sensitive dielectric material, thereby also reducing the probability of creating cracks therein, which may stem from corresponding cracks created in the cap layer, as is previously explained with reference to FIGS. 1a-1c. By providing the cap material with an appropriate internal compressive stress level, enhanced overall mechanical integrity and chemical stability may be achieved due to the presence of the cap material, while additionally the compressive stress level may reduce the defect rate during the CMP process, while at the same time a high degree of compatibility with conventional techniques may be maintained, since the degree of compressive stress may be established on the basis of well-established deposition recipes for a plurality of appropriate cap materials. For example, silicon dioxide, silicon nitride, nitrogen-containing silicon carbide and the like may be deposited with a high internal compressive stress level of approximately 200-700 MPa and even higher by selecting appropriate deposition parameters.

In still other illustrative embodiments, at least one further compressively stressed dielectric material may be provided, for instance, as an intermediate dielectric material layer, thereby even further enhancing the overall crack hindering effect of the compressively stressed material. For example, at a desired height level of the sensitive dielectric material, a compressively stressed intermediate material may be deposited, followed by a further sensitive dielectric material which may finally be covered by a compressively stressed cap layer, thereby providing a portion of sensitive dielectric material that is enclosed by corresponding compressively stressed dielectric materials, which may thus impart enhanced immunity with respect to the creation of micro cracks in the sensitive dielectric material. In still other illustrative embodiments, a corresponding compressively stressed dielectric material may be formed prior to depositing the sensitive dielectric material, thereby also enhancing the overall mechanical integrity of the dielectric material while additionally providing the possibility of using the compressively stressed dielectric material as a further functional portion in the overall layer stack, for instance in the form of an etch stop layer and/or a transition layer for the sensitive dielectric material and the like. Consequently, in combination with the compressively stressed cap layer, which may, in some illustrative embodiments, be substantially removed, that is, the cap layer may be removed except for any minute process-induced residues, the defect rate during a critical CMP process or any other planarization process may be efficiently reduced, while at the same time overall process complexity may not be unduly increased.

In still other illustrative embodiments, the probability of creating micro cracks during the planarization process may be reduced by applying compressive stress to the surface area to be polished by deforming the substrate as a whole. This may be accomplished, in some illustrative embodiments, by mechanically deforming the substrate during the planarization process on the basis of an appropriately designed substrate holder, which may, for instance, create a specific curvature that may result in a desired temporary degree of compressive stress level. In other cases, an appropriate material layer may be formed, for instance on the back side of the substrate, which may induce a global deformation of the substrate so as to obtain the desired compressive stress level at the surface, thus within a cap material and a sensitive dielectric material, during the CMP process. Consequently, in some illustrative embodiments, a corresponding cap material may be omitted or may be selected according to other criteria, such as the chemical behavior, the characteristics with respect to the previous manufacturing processes, such as the patterning of the sensitive dielectric material and the like, rather than requiring specific characteristics with respect to enhancing the overall mechanical stability during the CMP process.

Figure 1B:
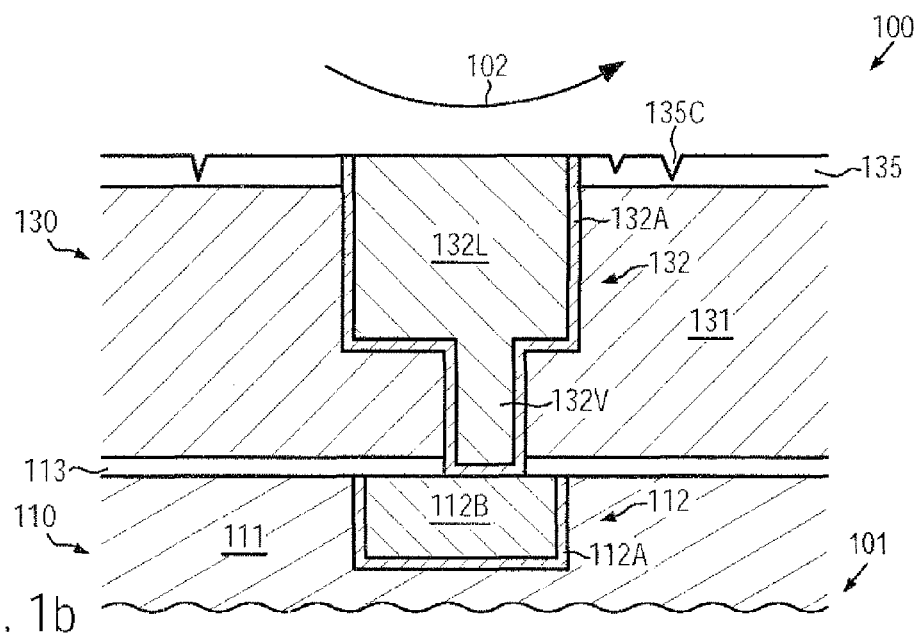
Figure 1C:
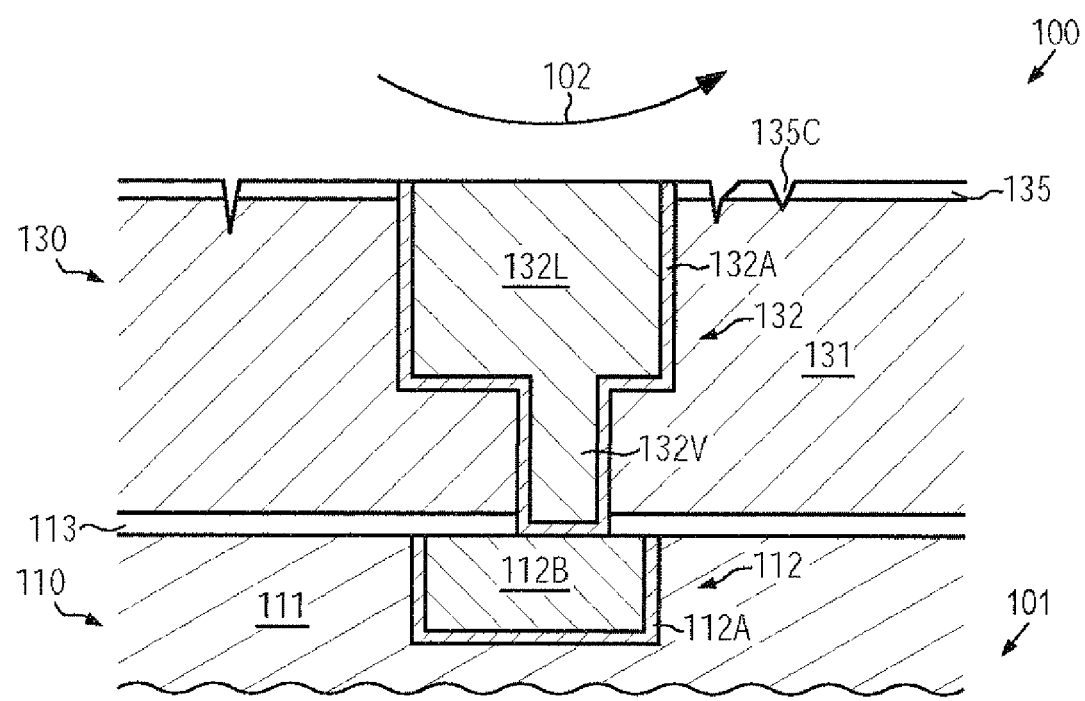

With reference to FIGS. 2a-2f and 3a-3b, further illustrative embodiments will now be described in more detail, wherein reference may also be made to FIGS. 1a-1c when appropriate.

Figure 2A:
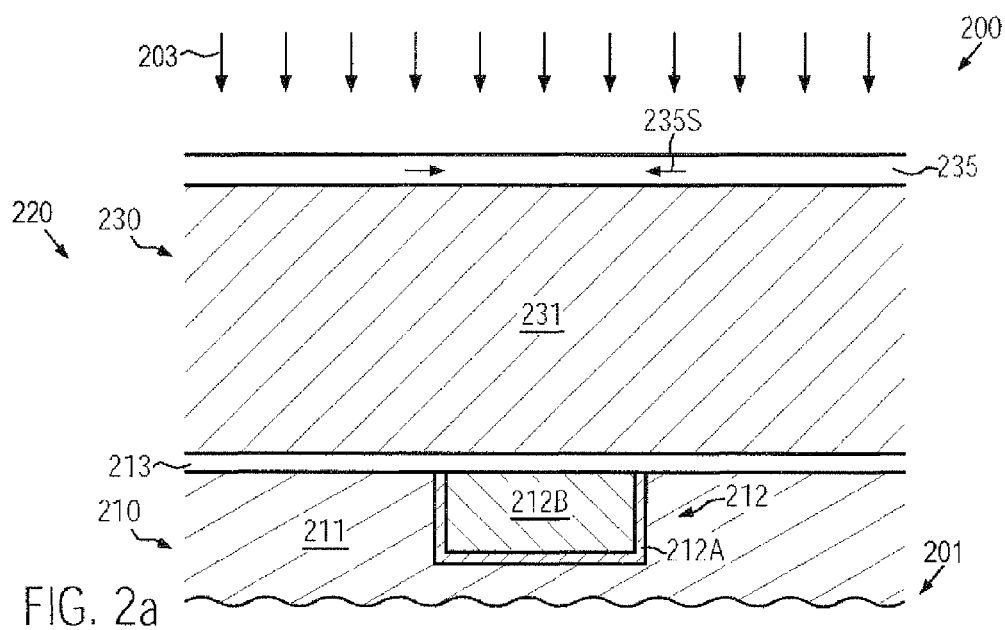
FIGS. 2a-2c schematically illustrate cross-sectional views of a semiconductor device during various manufacturing stages in forming a metallization system including a sensitive dielectric material with a reduced probability of creating micro cracks during a planarization process, according to illustrative embodiments.

FIG. 2a schematically illustrates a cross-sectional view of a semiconductor device 200 during an initial phase for forming a metallization layer. The semiconductor device 200 may comprise a substrate 201 in and above which one or more device levels may be provided, which may include circuit elements, contact elements, metal lines and vias and the like, depending on the overall configuration of the device 200. As is previously explained with reference to the device 100, the substrate 201 may represent any appropriate carrier material, such as a semiconductor substrate, a silicon-on-insulator (SOI) substrate and the like, which may have formed thereon an appropriate semiconductor layer for forming therein and thereabove circuit elements, such as transistors, capacitors, resistors and the like. For example, in sophisticated applications, transistor structures may be provided having critical dimensions, such as the gate length of field effect transistors and the like, of 50 nm and less. For convenience, any such circuit elements are not shown in FIG. 2a. Moreover, the semiconductor device 200 may comprise a metallization system 220 comprising, in the embodiment shown, a first metallization layer 210 and a second metallization layer 230. The first metallization layer 210 may comprise a dielectric material 211 in which may be provided one or more metal regions 212, such as metal lines, which may comprise a conductive barrier material 212A and a highly conductive metal 212B, such as copper, copper alloys, silver and the like. In other cases, the metallization layer 210 may comprise vias or contact elements connecting to circuit elements of a lower lying device layer, which may frequently be referred to as a contact structure, in which corresponding contact elements may provide the electrical connection of circuit elements to the very first metallization layer. The dielectric material 211 may comprise any appropriate material, such as "conventional" dielectrics in the form of silicon dioxide, silicon nitride, silicon oxynitride and the like, while in other cases, additionally or alternatively, low-k dielectric materials may be included, wherein a low-k dielectric material is to be understood as a material having a dielectric constant of 3.0 or less. In some illustrative embodiments, the dielectric material 211 may comprise a ULK material, i.e., a material having a dielectric constant of approximately 2.7 or less. Furthermore, an etch stop layer 213, which may be comprised of one or more material compositions, such as silicon carbide, nitrogen-containing silicon carbide, silicon nitride and the like, may be formed on the dielectric material 211 and above the highly conductive metal 212B which, in some illustrative embodiments, may be capped by an additional conductive material, such as various alloys and the like, in order to confine the metal 212B and provide enhanced electromigration behavior.

The metallization layer 230 comprises a dielectric material 231 which may contain a "sensitive" dielectric material which is to be understood as a dielectric material having a reduced mechanical stability, which is frequently accompanied by a reduced dielectric constant as may be required for achieving the desired electrical performance of the device 200. For example, a plurality of polymer materials are well established in the art, which may have a dielectric constant of approximately 2.7 and less and which may be used as at least a portion of the dielectric material 231. In other cases, silicon-containing dielectric materials including other components, such as carbon, oxygen, hydrogen and the like, may frequently be used, for instance in a porous state, so as to act as a ULK material. Also, in this case, a significantly reduced mechanical stability may be obtained compared to conventional dielectric materials. It should be appreciated that the dielectric material 231 may comprise other material compositions, for instance any type of "transition" materials which may connect to the etch stop layer 213 and may provide enhanced adhesion of a ULK material, which represents the dominant portion of the dielectric material 231. For convenience, any such transition materials are not shown in FIG. 2a. Furthermore, the metallization layer 230 may comprise a dielectric cap layer 235, which may have a desired internal compressive stress level 235S. In some illustrative embodiments, the internal stress level 235S may amount to approximately 200 MPa and higher, for instance 200-700 MPa, of compressive stress. In other illustrative embodiments, even higher internal compressive stress levels may be provided in the cap layer 235, which may amount to approximately 2 Gpa and higher. For instance, the cap layer 235 may be provided in the form of a silicon dioxide material, silicon nitride, nitrogen-containing silicon carbide, for which a plurality of deposition recipes may be available so as to adjust the desired internal compressive stress level. Consequently, contrary to conventional approaches in which frequently a tensile stressed cap material, such as the cap layer 135 of FIGS. 1a-1c, may be used, the present disclosure provides a compressive stress level to create compressive forces on the dielectric material 231 during the subsequent processing of the device 200, in particular during a planarization process to be performed in a later manufacturing stage.

The semiconductor device 200 as shown in FIG. 2a may be formed on the basis of the following processes. First any circuit elements, such as transistors and the like, may be formed on the basis of well-established manufacturing techniques followed by the formation of an appropriate contact structure, such as the layer 210, when representing a contact layer. Thereafter, one or more metallization layers of the system 220 may be formed wherein, for convenience, at least in some metallization layers, such as the layer 230, the cap layer 235 may be provided so as to have the intrinsic compressive stress level 235S. For example, if the layer 210 may represent a metallization layer, similar process techniques may be used as will be described with reference to the layer 230, while in other cases conventional manufacturing techniques may be employed if the dielectric material 211 may exhibit appropriate characteristics, for instance with respect to mechanical stability and the like. In this case, similar process techniques may be used as previously discussed with reference to the metallization layer 110. Hence, after the deposition of the etch stop layer 213, one or more transition layers (not shown) may be deposited, if required, followed by the deposition of a low-k dielectric material in order to form the dielectric layer 231. For this purpose, any well-established spin-on, CVD techniques and the like may be used. Next, the compressive cap layer 235 may be formed by any appropriate deposition technique. For example, silicon dioxide material may be deposited with a high compressive stress level by plasma enhanced CVD from TEOS, wherein, in some illustrative embodiments, a certain amount of fluorine-containing precursors may be added to obtain fluorine-doped silicon dioxide having a reduced permittivity compared to silicon dioxide when a portion of the layer 235 may be maintained throughout a subsequent processing. In other cases, the cap layer 235 may be removed in a later manufacturing stage, thereby not requiring a specific adaptation of the dielectric constant. During a corresponding deposition process 203, at least one process parameter may be controlled such that the layer 235 may be deposited with a specified amount of compressive stress. For instance, the magnitude of the compressive stress created during the deposition of the layer 235 may depend on the gas mixture, the deposition temperature, the magnitude of the bias voltage created by, for instance, a low frequency bias, which may usually be available in advanced CVD tools allowing a dual frequency operation. For instance, with a producer system from Applied Materials Inc, a silicon dioxide layer having a compressive stress in the range of 300-400 MPa may be obtained on the basis of the following process parameters. The pressure during the deposition may be adjusted to approximately 3-6 Torr while the high frequency power for establishing a plasma ambient may be set to approximately 70-150 Watt, resulting in an appropriate power density within the plasma atmosphere that is also determined by the specific geometric configuration of the reactor chamber. The power supplied in the form of low frequency energy is set to approximately 250-350 Watt. The deposition temperature is selected to be approximately 350-450° C., for instance approximately 400° C., and the gas flow for the carrier gas in the form of helium is set to approximately 1000-4000 sccm (standard cubic centimeter per minute), for example at approximately 3000 sccm, while oxygen is supplied with a flow rate of approximately 1000-1400 sccm. TEOS is supplied with approximately 1800-2000 mg per minute. With the above-specified deposition tool and the process parameters as specified before, a deposition rate of approximately 5-8 nm per second may be obtained. A thickness of the layer 235 may range from approximately 10-100 nm, depending on process and device requirements. It is to be appreciated that other process parameters may be established on the basis of the above teaching when different deposition tools and/or substrate diameters are used.

In other illustrative embodiments, the cap layer 235 may be comprised of other material compositions, such as silicon nitride, nitrogen-containing silicon carbide and the like, for which well-established plasma enhanced CVD techniques are available to provide a desired magnitude of compressive stress. For example, dielectric materials in the form of silicon nitride, nitrogen-containing silicon carbide and the like are frequently used in the contact level of sophisticated semiconductor devices to exert tensile and compressive stress in a local manner in order to enhance overall transistor performance. An appropriate internal stress level may be established on the basis of appropriately selected process parameters, for instance, the degree of ion bombardment during the deposition, in order to obtain, for instance, a high compressive stress level which may be approximately 2 Gpa and even higher, if a corresponding stress level is desirable for the cap layer 235. Hence, a plurality of materials may be available in which any magnitude of compressive stress from a few hundred MPa to several GPa may be generated, thereby generating "pushing" forces in the layer 235 and also in the layer 231, which may counteract any tendency for creating micro cracks in a subsequent manufacturing stage.

Figure 2B:
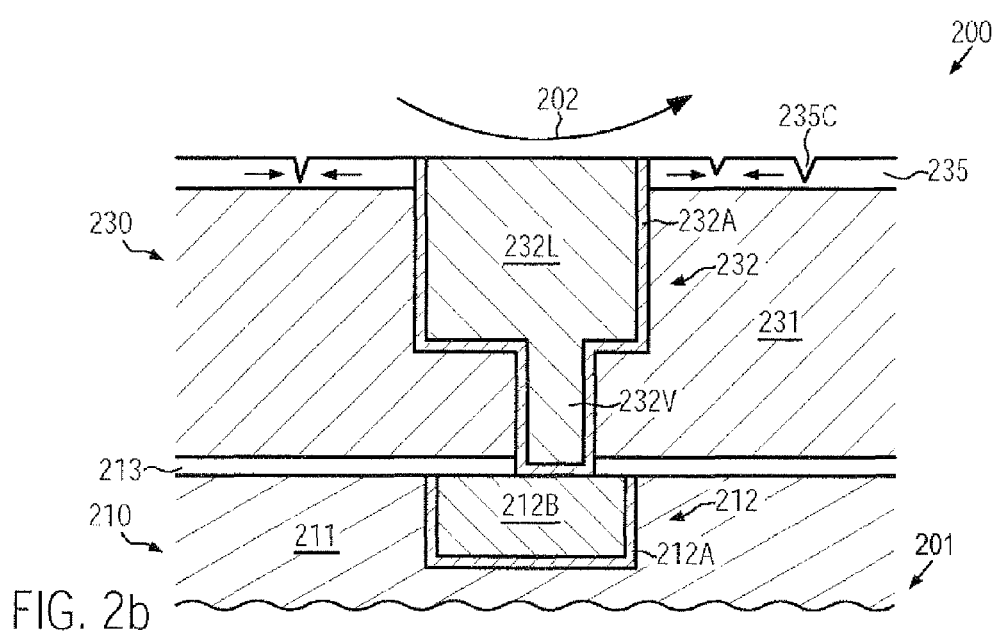

FIG. 2b schematically illustrates the semiconductor device 200 in an advanced manufacturing stage. As illustrated, the metallization layer 230 may comprise a metal region 232 including a highly conductive metal, such as copper, copper alloy, silver and the like, possibly in combination with a conductive barrier material 232A. The conductive barrier material 232A may contain any appropriate material composition to provide the desired electrical and mechanical characteristics, that is, to provide the desired electromigration behavior, the adhesion, the diffusion hindering effect and the like. The metal region 232 may comprise a metal line 232L and a via 232V connecting to the metal region 212, while, in other cases, any other appropriate configuration for the metal region 232 may be used, depending on the overall device configuration. The metal region 232 may be formed in accordance with any well-established process technique, as is, for instance, described with reference to the device 100. Furthermore, in the manufacturing stage shown, a planarization process 202 may be performed to remove any excess material of the metal region 232 and also remove at least a portion of the cap layer 235. For example, the planarization process 202 may include a CMP process wherein, however, an enhanced removal rate may be achieved compared to conventional processes, since the compressive cap layer 235 may significantly reduce the creation of respective micro cracks 235C, or may at least reduce a size thereof, since the compressive forces within the layer 235 may have a tendency to "close" the cracks 235C, thereby also suppressing a propagation or widening of the cracks 235C. Consequently, a propagation of the cracks 235C during the process 202 into the sensitive dielectric material 231 may be significantly suppressed.

Figure 2C:
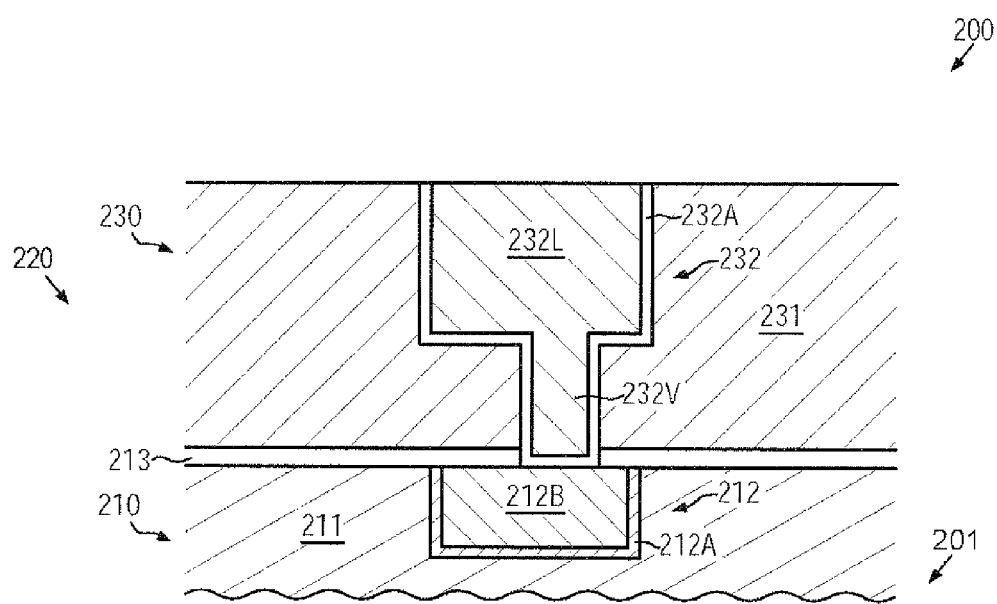

FIG. 2c schematically illustrates the semiconductor device in a further advanced manufacturing stage according to some illustrative embodiments in which the cap layer 235 (FIG. 2b) may have been removed in a substantially complete manner, i.e., the layer 235 may be removed except for any process variations, for instance caused by across-substrate non-uniformities of the deposition process 203 (FIG. 2a) and the planarization process 202 (FIG. 2b). Moreover, the dielectric material 231 may have a surface portion with a reduced amount and/or size of any cracks created during the previous planarization process 202. Consequently, the further processing of the semiconductor device 200, for instance, the manufacturing of one or more additional metallization layers and the like, may be performed on the basis of the layer 230 having an enhanced uniformity and mechanical integrity due to the reduced size and number of corresponding defects caused by the subsequent planarization process.

It should be appreciated that the metallization layer 210 may also be formed on the basis of a corresponding compressively stressed cap layer, if the dielectric material 211 may represent a sensitive dielectric material, for instance in the form of a ULK material, the damaging of which may thus be reduced due to the compressive nature of the corresponding cap layer. Thus, in addition to an enhanced mechanical integrity of the metallization system 220, a reduced cycle time may also be accomplished since the planarization process 202 including a CMP process may be performed on the basis of, for instance, an increased down force, thereby providing an increased removal rate, while the deposition of the compressive cap layer 235 may be performed on the basis of a deposition rate that is comparable to the deposition rate of conventionally used cap layers, as previously explained with reference to the device 100.

Figure 2D:
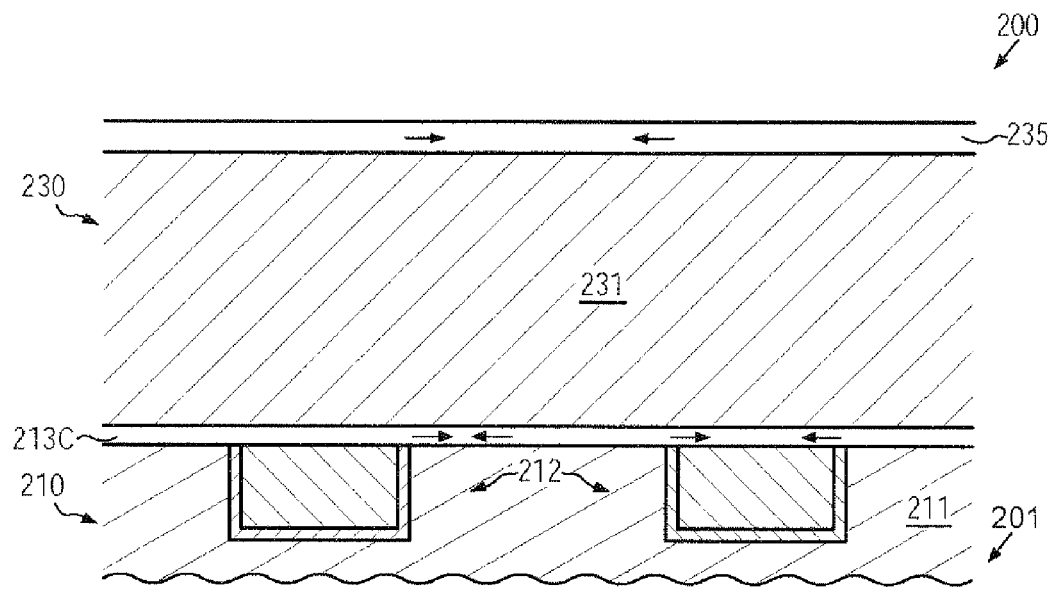
FIGS. 2d-2f schematically illustrate cross-sectional views of the semiconductor device according to still further illustrative embodiments in which at least one further compressive stress-inducing layer may be provided to enhance the crack hindering effect during a CMP process.

FIG. 2d schematically illustrates the semiconductor device 200 according to further illustrative embodiments. As illustrated, the first metallization layer 210 may comprise a compressive cap layer 213C formed above the dielectric material 211 and the one or more metal regions 212. The compressive layer 213C may represent a cap layer for confining the metal in the metal regions 212 or may represent any appropriate transition material for adapting the characteristics of the material 231 to the characteristics of the metallization layer 210. In one illustrative embodiment, the compressive layer 213C may also act as an etch stop material for patterning the dielectric material 231 of the metallization layer 230.

Figure 2E:
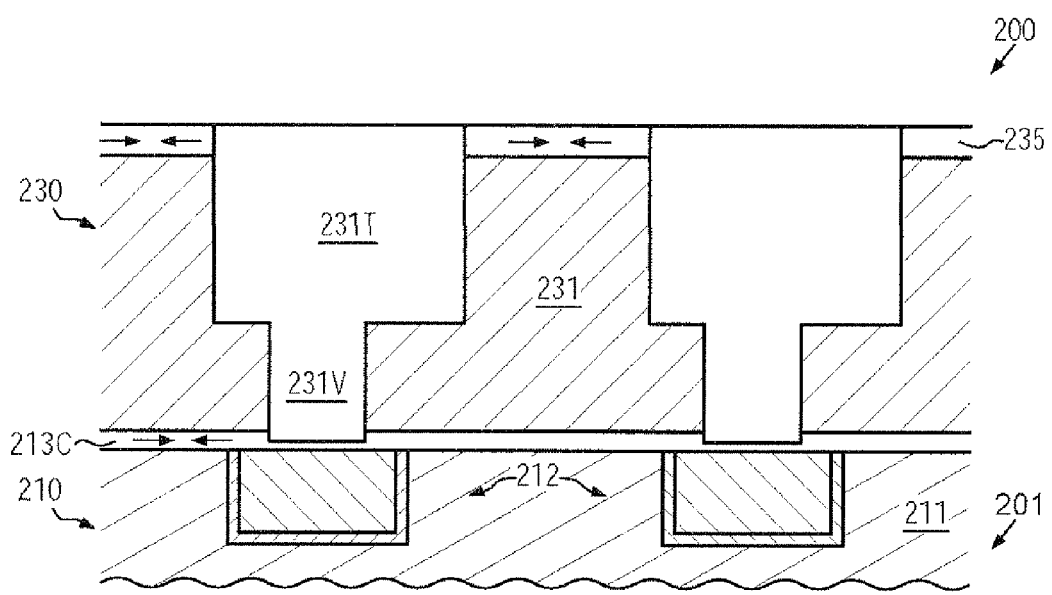

FIG. 2e schematically illustrates the semiconductor device 200 in an advanced manufacturing stage in which corresponding openings 231T and 231V are formed in the dielectric material 231 and also in the compressive cap layer 235. The openings 231T, 231V may be formed in accordance with any appropriate patterning regime, such as dual damascene techniques and the like, wherein the patterning of the openings 231V may be performed on the basis of an appropriate etch mask, wherein the compressive layer 213C may be used as an etch stop material. For example, the layer 213C may be comprised of silicon nitride, nitrogen-containing silicon carbide, silicon dioxide, at least in the form of a sub-layer of the compressive layer 213C, or any appropriate composition thereof, in order to obtain the desired etch stop capabilities, while also generating a desired compressive stress level. With respect to forming the layer 213C, similar criteria may apply as previously explained with reference to the layer 235. After forming the openings 231T and 231V and completely opening the layer 213C so as to expose a portion of the metal regions 212, the further processing may be continued by filling in a conductive barrier material, if required, and a highly conductive metal. Thereafter, any excess material may be removed by a planarization process, such as the process 202 (FIG. 2b) wherein an enhanced mechanical stability of the dielectric material 231 may be achieved by "confining" the material 231 by the two compressively stressed layers 235 and 213C.

Figure 2F:
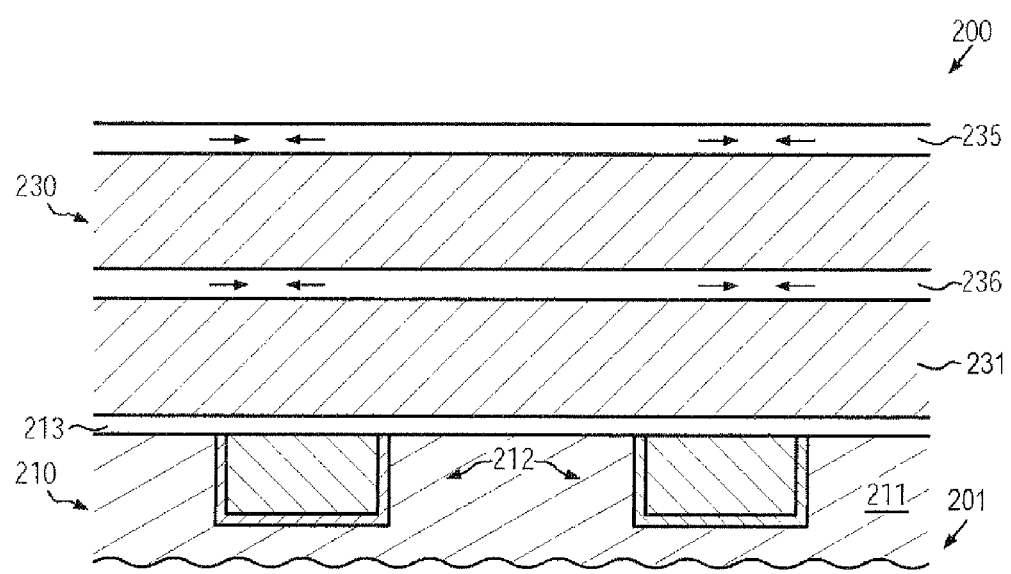

FIG. 2f schematically illustrates the semiconductor device 200 according to further illustrative embodiments in which at least one further compressively stressed dielectric material 236 may be provided in addition to the compressive cap layer 235. The compressive layer 236 may be located at any appropriate position within the dielectric material 231 in order to provide enhanced overall mechanical stability and to act as a crack hindering layer. For example, the layer 236 may be positioned close to the layer 235 (not shown), thereby providing a surface portion of the dielectric material 231 which may also exhibit a reduced probability for creating micro cracks, even if the layer 235 is substantially removed during the corresponding planarization process 202 (FIG. 2b). In other cases, as illustrated in FIG. 2f, the layer 236 may be positioned so as to act as an etch stop layer for forming the corresponding trench openings 231T (FIG. 2e), thereby enhancing overall process uniformity during the patterning of corresponding metal lines and vias.

With respect to a material composition and a deposition technique for forming the layer 236, the same criteria apply as previously explained with reference to the layer 235. It should further be appreciated that, if required, the layer 213C (FIG. 2e) may additionally be provided with an appropriate compressive stress, thereby even further enhancing the overall mechanical stability of the metallization layer 230.

Figure 3A:
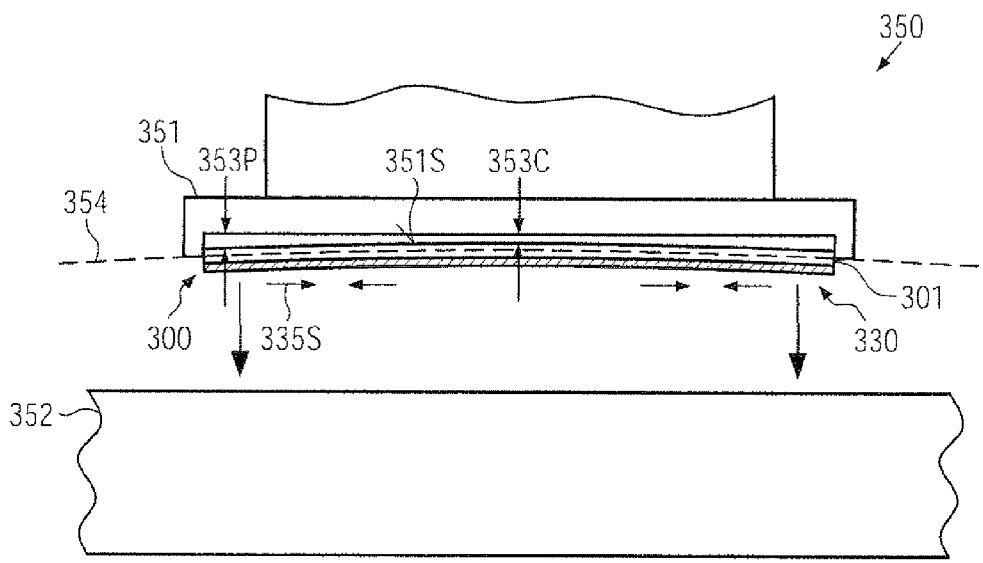
FIGS. 3a-3b schematically illustrate semiconductor devices during manufacturing stages in forming a metallization layer including a sensitive dielectric material, wherein the probability of creating cracks in the sensitive dielectric material may be reduced by deforming the substrate during the CMP process.
Figure 3B:
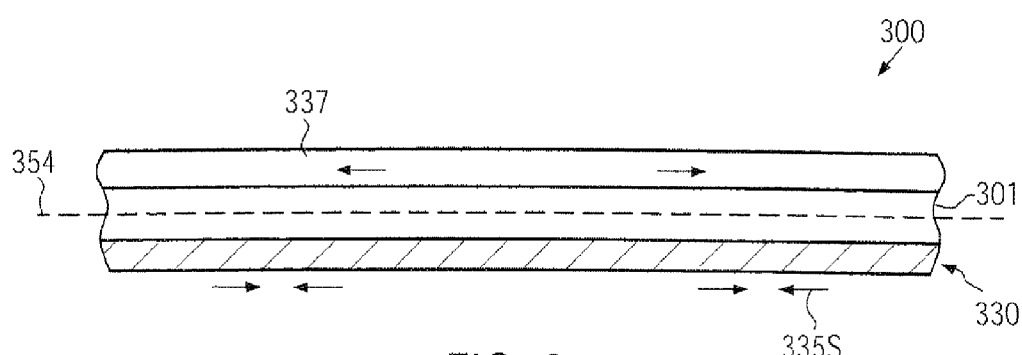

With reference to FIGS. 3a-3b, further illustrative embodiments will now be described in which compressive stress may be applied, at least during a planarization process, by globally deforming the carrier substrate.

FIG. 3a schematically illustrates a cross-sectional view of a semiconductor device 300 comprising a substrate 301, above which may be formed a metallization layer 330 at an advanced manufacturing stage, i.e., the metallization layer 330 may comprise a low-k dielectric material or a ULK dielectric material and may also comprise excess metal material that may be removed on the basis of a CMP process. With respect to the semiconductor device 300 and the metallization layer 330, similar criteria may apply as previously explained with reference to the devices 100 and 200. Thus, for removing any excess material, the substrate 301 may be positioned in a substrate holder 351 of a polishing tool 350. It should be appreciated that only a portion of the polishing tool 350 is illustrated in a schematic view in FIG. 3a. The substrate holder 351 may represent a polishing head of a CMP tool, which may be configured so as to receive the substrate 301 and place the substrate 301 against a polishing pad 352 with a specified down force and an appropriate relative motion between the substrate 301 and the polishing pad 352. In the embodiment shown, the substrate 301 may be positioned within the substrate holder 351 such that a global deformation of the substrate 301 may be accomplished such that a corresponding compressive stress level 335S may be induced at and in the surface to be polished, i.e., the metallization layer 330. For example, the substrate holder 351 may be configured such that a distance 353P of a planar surface 351S of the substrate holder 351 may be greater at the periphery of the substrate 301 compared to a corresponding distance 353C at the center. Consequently, a corresponding radius of curvature 354 may be created, which may result in the desired compressive stress component 335S at the metallization layer 330. On the other hand, effective down force may be selected differently at the periphery and the center so as to obtain a uniform removal rate during the polishing process, even if the global deformation of the substrate 301 may result in a slight difference of removal rate during the polishing process. Consequently, during the polishing process, the compressive stress component 335S may provide a reduced probability of creating or increasing micro cracks, thereby also suppressing the propagation of micro cracks into the sensitive dielectric material of the metallization layer 330. Thus, in some illustrative embodiments, a corresponding cap layer, such as the layer 135 (FIGS. 1a-1b) may be selected in accordance with conventional process recipes since the desired stress component 335S may be obtained temporarily during the polishing process within the tool 350. In other illustrative embodiments, a compressive cap layer may be provided, such as the layer 235 (FIGS. 2a-2f), however, with a reduced thickness, a reduced compressive stress level and the like, thereby providing enhanced flexibility in selecting appropriate materials and deposition techniques for forming the corresponding cap layer.

FIG. 3b schematically illustrates the semiconductor device 300 according to still other illustrative embodiments in which a global deformation of the substrate 301 and thus the compressive stress 335S may be obtained by forming a stress-inducing layer 337 at the back side of the substrate 301. For example, any appropriate material, such as silicon nitride and the like, may be deposited with a high tensile stress level with an appropriate thickness to create a corresponding curvature 354, which may thus result in the compressive stress component 335S. Thereafter, the device 300 may be processed in a CMP tool, such as the tool 350, substantially without requiring specific hardware components for creating the compressive stress component 335S temporarily during the corresponding planarization process. As previously explained, a plurality of well-established materials, such as silicon nitride, may be deposited with a high internal tensile stress level, which may result in a corresponding global deformation of the substrate 301. Hence, a reduced probability of creating micro cracks in sensitive dielectric materials of the metallization layer 330 may be accomplished. Also, in this case, the layer 330 may be provided with or without a compressive cap layer, as explained above.

As a result, the present disclosure provides techniques for forming metallization layers including sensitive dielectric materials, such as ULK materials, wherein the mechanical stability may be enhanced during the planarization process for removing excess metal by applying a compressive stress level, which may reduce the probability of creating micro cracks in the sensitive dielectric material. In some illustrative embodiments, this may be accomplished on the basis of a compressive cap layer, while, in other cases, in addition to or alternatively to the compressive cap layer, a global deformation of the substrate may be employed, at least during the planarization process.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   providing a substrate having formed thereabove a metallization layer of a semiconductor device, said metallization layer comprising a low-k dielectric material;
   deforming said substrate to temporarily induce a first compressive stress in an upper surface of said low-k dielectric material;
   removing excess material from above said low-k dielectric material by performing a planarization process while maintaining at least a portion of said temporarily induced first compressive stress in said low-k dielectric material; and
   removing said remaining portion of said temporarily induced first compressive stress after performing said planarization process.

2. The method of claim 1, further comprising inducing a second compressive stress in said upper surface of said low-k dielectric material prior to performing said planarization process, wherein inducing said second compressive stress comprises forming a compressive cap layer above said low-k dielectric material.

3. The method of claim 1, wherein deforming said substrate comprises placing said substrate on a substrate holder and using said substrate holder for temporarily inducing said first compressive stress.

4. The method of claim 1, wherein deforming said substrate comprises temporarily forming a stress-inducing layer on a back side of said substrate.

5. The method of claim 1, further comprising forming an opening in said low-k dielectric material and filling said opening with a metal-containing material prior to performing said planarization process.

6. The method of claim 2, wherein said compressive cap layer is formed with an internal compressive stress level of approximately 200 Mega Pascal or higher.

7. The method of claim 6, wherein said internal compressive stress level is approximately 500 Mega Pascal or higher.

8. The method of claim 2, wherein performing said planarization process comprises performing a chemical mechanical planarization process.

9. The method of claim 2, wherein removing excess material from above said low-k dielectric material comprises removing at least a portion of said compressive cap layer.

10. The method of claim 2, wherein said low-k dielectric material has a dielectric constant of approximately 2.7 or less.

11. The method of claim 2, wherein forming said compressive cap layer comprises depositing a silicon dioxide material.

12. The method of claim 2, wherein said compressive cap layer is substantially completely removed when performing said planarization process.

13. The method of claim 2, wherein forming said compressive cap layer comprises depositing a silicon and nitrogen containing material.

14. The method of claim 13, wherein said silicon and nitrogen containing material additionally comprises carbon.

15. The method of claim 2, further comprising forming at least one further compressive material layer to induce a compressive stress in said low-k dielectric material.

16. The method of claim 15, wherein said at least one further compressive material layer is formed within said low-k dielectric material.

17. The method of claim 15, wherein one of said at least one further compressive material layer is formed prior to forming said low-k dielectric material.

18. The method of claim 17, wherein one of said at least one further compressive material layer is used as an etch stop material when forming said opening in said low-k dielectric material.

19. A method of forming a metallization layer of a semiconductor device, the method comprising:

forming an opening in a low-k dielectric material formed above a substrate;

filling said opening with a metal-containing material;

applying compressive stress to an upper surface of said low-k dielectric material by deforming a center of a said substrate relative to a periphery of said substrate; and removing excess material of said metal-containing material by performing a chemical mechanical polishing process while maintaining at least a portion of said compressive stress in said upper surface of said low-k dielectric material.

20. The method of claim 19, wherein applying said compressive stress to said upper surface of said low-k dielectric material further comprises forming a compressive cap layer above said low-k dielectric material.

21. The method of claim 19, wherein said substrate is deformed at least while performing said chemical mechanical polishing process.

22. A method, comprising:

providing a substrate having formed thereabove a metallization layer of a semiconductor device, said metallization layer comprising a low-k dielectric material;

inducing a compressive stress in said low-k dielectric material;

after inducing said compressive stress in said low-k dielectric material, removing excess material from above said low-k dielectric material by performing a planarization process while maintaining at least a portion of said compressive stress in said low-k dielectric material; and deforming said substrate when performing said planarization process.

23. The method of claim 22, wherein deforming said substrate comprises placing said substrate on a substrate holder and using said substrate holder for inducing said compressive stress.

24. The method of claim 22, wherein deforming said substrate comprises temporarily forming a stress-inducing layer on a back side of said substrate.

* * * * *